(12) United States Patent
Sallem et al.

(10) Patent No.: US 10,436,832 B2
(45) Date of Patent: Oct. 8, 2019

(54) METHOD OF ANALYZING A CABLE, BASED ON AN AUTO-ADAPTIVE CORRELATION, FOR THE DETECTION OF SOFT DEFECTS

(71) Applicant: COMMISSARIAT A L'ENERGIE ATOMIQUE ET AUX ENERGIES ALTERNATIVES, Paris (FR)

(72) Inventors: Soumaya Sallem, Nogent sur Oise (FR); Nicolas Ravot, Chelles (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 289 days.

(21) Appl. No.: 15/515,829

(22) PCT Filed: Sep. 21, 2015

(86) PCT No.: PCT/EP2015/071606
§ 371 (c)(1),
(2) Date: Mar. 30, 2017

(87) PCT Pub. No.: WO2016/050547
PCT Pub. Date: Apr. 7, 2016

(65) Prior Publication Data
US 2018/0328975 A1    Nov. 15, 2018

(30) Foreign Application Priority Data

Oct. 2, 2014  (FR) ..................... 14 59402

(51) Int. Cl.
*G01R 31/11*    (2006.01)
(52) U.S. Cl.
CPC .................. *G01R 31/11* (2013.01)

(58) Field of Classification Search
CPC ......... G01D 11/245; G01D 5/16; G01D 11/24
USPC .................... 324/533, 543; 702/59
See application file for complete search history.

(56) References Cited

U.S. PATENT DOCUMENTS

| | | | |
|---|---|---|---|
| 7,194,752 B1* | 3/2007 | Kenyon | G10L 25/48 725/22 |
| 2010/0141264 A1* | 6/2010 | Ravot | G01R 31/11 324/533 |
| 2010/0211338 A1* | 8/2010 | Ravot | G01R 31/086 702/59 |

FOREIGN PATENT DOCUMENTS

| | | |
|---|---|---|
| FR | 2 907 910 A1 | 5/2008 |
| FR | 2 981 752 A1 | 4/2013 |
| WO | 2005/109020 A2 | 11/2005 |

OTHER PUBLICATIONS

Y.J. Shin, "Theory and Application of Time-Frequency analysis to transient phenomena," in Electric Power and other Physical Systems, PhD Thesis, University of Texas, 2004.

* cited by examiner

*Primary Examiner* — Farhana A Hoque
(74) *Attorney, Agent, or Firm* — Baker & Hostetler LLP

(57) ABSTRACT

A method for analyzing a cable into which a reference signal s of time support limited to a duration T is injected comprises the following steps: calculating the intercorrelation, in a sliding window of duration D at least equal to 2T, between the injected reference signal s and a measurement r of the reflection of the reference signal s in the cable, normalizing the calculated intercorrelation by a factor dependent on the integration of the reflection measurement r over the same sliding window of duration D.

11 Claims, 5 Drawing Sheets

METHOD OF ANALYZING A CABLE, BASED ON AN AUTO-ADAPTIVE CORRELATION, FOR THE DETECTION OF SOFT DEFECTS

CROSS-REFERENCE TO RELATED APPLICATIONS

This application is a National Stage of International patent application PCT/EP2015/071606, filed on Sep. 21, 2015, which claims priority to foreign French patent application No. FR 1459402, filed on Oct. 2, 2014, the disclosures of which are incorporated by reference in their entirety.

FIELD OF THE INVENTION

The invention relates to a reflectometry method and system for detecting and locating soft defects in a cable. The field of the invention is that of wiring diagnostic systems based on the reflectometry principle.

BACKGROUND

Cables are omnipresent in all electrical systems, for the supply of power or transmission of information. These cables are subject to the same stresses as the systems that they connect and may be subject to failures. It is therefore necessary to be able to analyze their state and to return information on the detection of faults, but also on their location and their type, in order to help with maintenance. Conventional reflectometry methods allow this type of test to be carried out.

Reflectometry methods employ a principle that is close to that of radar: an electrical signal, the probe signal, often of high-frequency or wideband, is injected at one or more points into the cable to be tested. Said signal propagates through the cable or network and some of its energy is reflected when it encounters an electrical discontinuity. An electrical discontinuity may for example result from a connection, from the end of the cable or from a fault, or more generally from an abrupt change in the propagation conditions of the signal in the cable. Discontinuities most often result from faults that modify the characteristic impedance of the cable locally, thereby creating a discontinuity in its linear parameters.

The analysis of the reflected signals at the point of injection makes it possible to deduce therefrom information on the presence and location of these discontinuities, and therefore of any faults. An analysis in the time or frequency domain is conventionally carried out. These methods are designated by the acronyms TDR (for time-domain reflectometry) and FDR (for frequency-domain reflectometry).

The invention applies to any type of electric cable, in particular power transmission cables or communication cables, whether in fixed or mobile installations. The cables in question may be coaxial cables, twin-lead cables, parallel-line cables, twisted-pair cables or any other type of cable provided that it is possible to inject a reflectometry signal into it and to measure its reflection.

Known time-domain reflectometry methods are particularly suitable for detecting, in a cable, hard faults such as a short-circuit or an open circuit or more generally any significant local modification of the impedance of the cable. A fault is detected by measuring the amplitude of the signal reflected from this fault, which increases and therefore becomes more detectable as the hardness of the fault increases.

In contrast, a soft defect, for example resulting from a superficial degradation of the cladding, insulator or conductor of the cable, generates a low-amplitude peak in the reflected reflectometry signal and therefore one that is not easily detectable with conventional time-domain methods.

The detection and location of soft defects in cables is a substantial problem for the industrial world because a fault in general first appears as a superficial fault but may, with time, progress to become more severe. For this reason in particular, it is useful to be able to detect the appearance of a fault as soon as it appears and at a stage at which its impact is superficial, in order to prevent it from becoming more severe.

Known methods allowing soft defects to be identified in a cable are most often time-frequency domain reflectometry methods. These methods were developed in order to allow better detection of low-amplitude reflected signals.

In particular, the "Joint Time-Frequency Domain Reflectometry" method described in document [1], which proposes the use of a Wigner-Ville frequency transform, is known. This method allows better discrimination between signals reflected from soft defects, with a good time and frequency resolution. However it has the two-fold drawback of being complex to implement in an on-board system and of causing problems with false detections due to the existence of cross terms in the aforementioned transform.

The French patent application of the Applicant published under the number FR 2981752 proposes an improvement to the time-frequency method described in [1], allowing the influence of the cross terms to be eliminated and the problems with false detections to be solved.

However, this method still has the drawback of substantial complexity with regard to implementation in portable pieces of equipment.

Moreover, the French patent application of the Applicant published under number FR 2907910 is also known, this document providing another analyzing method based on injection of pseudo-random sequences into the cable to be tested.

The invention proposes a method for analyzing a cable with a view to detecting soft defects, which has a low implementational complexity and which is particularly suitable for implementation in a portable and/or on-board device.

The method according to the invention allows very low-amplitude signals to be detected even when the measurement environment is noisy and other reflections of higher amplitude are present.

The objective targeted by the invention is achieved by virtue of the use of an intercorrelation function normalized by a particular coefficient allowing the obtained reflectogram to self-adapt in order to make low-amplitude reflections stand out.

SUMMARY OF THE INVENTION

Thus one subject of the invention is a method for analyzing a cable into which a reference signal s of time support limited to a duration T is injected, characterized in that it comprises the following steps:

calculating the intercorrelation, in a moving window of duration D at least equal to 2T, between said injected reference signal s and a measurement r of the reflection of said reference signal s in the cable, normalizing the calculated intercorrelation by a factor dependent on the integration of said reflection measurement r over the same moving window of duration D.

According to one particular aspect of the invention, the factor dependent on the integration of the reflection measurement r is equal to the absolute value of said integration raised to a power lower than one.

According to one particular aspect of the invention, said power is equal to ½.

According to one particular aspect of the invention, the factor dependent on the integration of the reflection measurement r is equal to the logarithm of the absolute value of said integration.

According to one variant embodiment, the method for analyzing a cable according to the invention furthermore comprises the following steps:

calculating the intercorrelation, in a moving window of duration D at least equal to 2T, between said injected reference signal s and the calculated normalized intercorrelation, normalizing the intercorrelation calculated in the preceding step by a factor dependent on the integration of the normalized intercorrelation over the same moving window of duration D.

According to one variant embodiment, said method furthermore includes a step of seeking at least one extremum of the normalized intercorrelation indicating the presence of a fault in the cable.

According to one particular aspect of the invention, the injected reference signal is a Gaussian pulse.

Another subject of the invention is a device for analyzing a cable comprising means suitable for implementing the analyzing method according to the invention.

This device may comprise means for measuring, at a point of the cable, a signal reflected in the cable and a processor that is configured to execute the analyzing method according to the invention.

Yet another subject of the invention is a reflectometry system comprising a device for analyzing a cable according to the invention, said system possibly furthermore comprising means for injecting, at a point of the cable, a reference signal.

Yet another subject of the invention is a computer program including instructions for executing the method for analyzing a cable according to the invention, when the program is run by a processor and a processor-readable storage medium on which is stored a program including instructions for executing the method for analyzing a cable according to the invention, when the program is run by a processor.

BRIEF DESCRIPTION OF THE DRAWINGS

Other features and advantages of the present invention will become more clearly apparent on reading the following description with reference to the appended drawings, which show.

DETAILED DESCRIPTION

Figure 1:
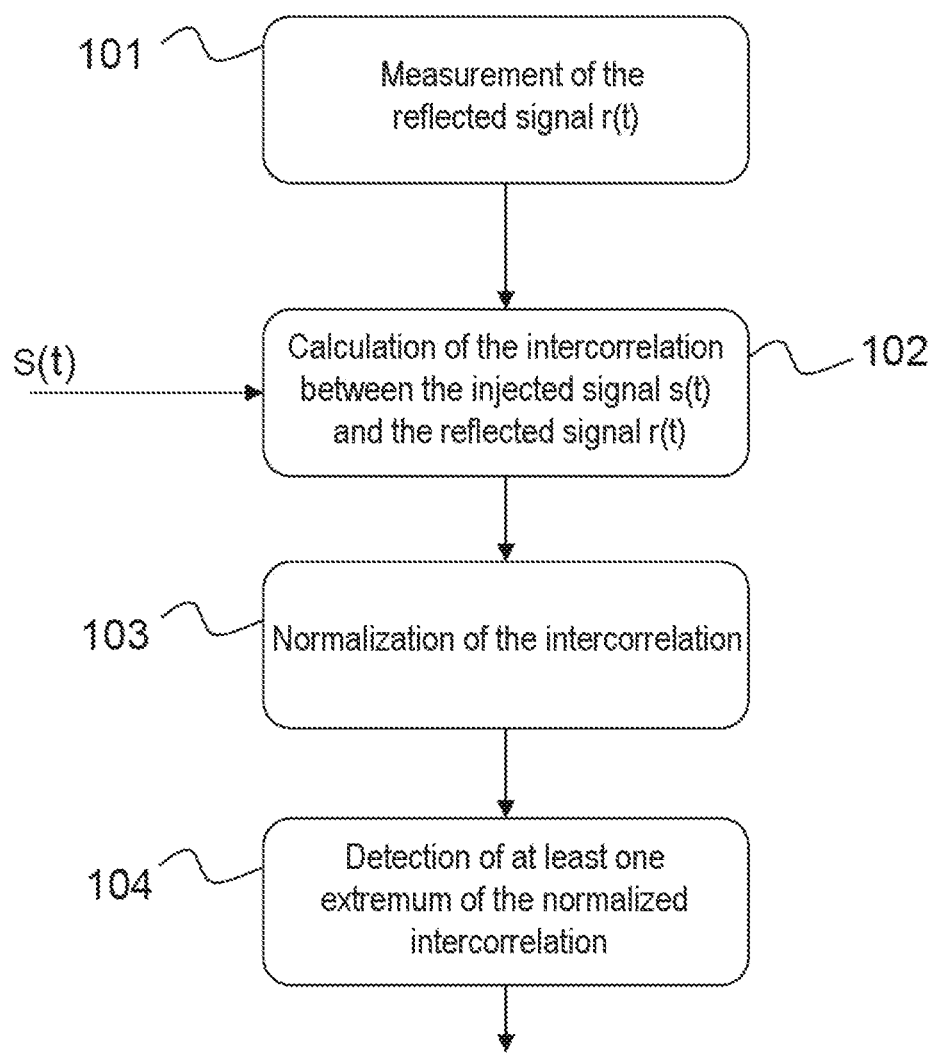
FIG. 1, a flowchart illustrating the steps of the analyzing method according to the invention.

FIG. 1 shows the main steps implemented in the analyzing method according to the invention.

According to the well-known principle of reflectometry methods, a reference signal S(t) is injected at a point into the cable to be analyzed, this point possibly being one end of the cable or an injection point located anywhere on the cable.

In a first step 101 of the method according to the invention, the reflection r(t) of the injected signal is measured. This measurement may be made at the injection point or at another measurement point located anywhere on the cable. The reflected signal is measured over a given duration in particular set depending on the length of the cable and its physical characteristics (for example the propagation speed of the signal in the cable).

In a second step 102, the intercorrelation between the injected signal and the reflected signal is calculated. The intercorrelation is advantageously calculated over a duration at least equal to 2T where T is the duration of the injected time support. For example, if the injected signal is a Gaussian pulse, T is the duration of the pulse.

$$c_1(t) = \int_{t-T}^{t+T} r(t') s(t'-t) dt'$$

In a first step 103, the integral of the reflected signal over a duration at least equal to 2T is calculated.

$$c_2(t) = \int_{t-T}^{t+T} r(t') dt'$$

The term $C_2(t)$ corresponds to a factor close to the mean of the reflected signal r(t) over a duration 2T or even to its energy.

Next, a normalization factor is calculated from the term $C_2(t)$. This factor may for example be equal to the square root of the absolute value of the term $C_2(t)$ but it may, more generally, be equal to a power lower than 1 of the absolute value of the term $C_2(t)$ or even to the logarithm of this term. Without departing from the context of the invention, any normalization factor dependent on the term $C_2(t)$ is envisionable.

At the end of step 103, a time-domain reflectogram $$z(t) = \frac{c_1(t)}{f(c_2(t))}$$

is obtained where f( ) is a first-order mathematical function.

For example, if f is the function square root of the absolute value, the time-domain reflectogram obtained will be of the form $$z(t) = \frac{c_1(t)}{\sqrt{|c_2(t)|}}.$$

The choice of the function f( ) in particular depends on the level of noise impacting the measurement of the reflected signal.

The use of a normalization factor dependent on the energy of the reflected signal allows the gain with which signatures correlated with the injection signal are amplified to be increased for the low-amplitude signatures that are representative of soft defects.

Furthermore artefacts due to measurement noise are not amplified by the method because the noise is decorrelated from the injected signal.

Steps 102 and 103 are applied in a moving time window of duration at least equal to 2T so as to construct a reflectogram z(t) of duration equal to the duration of the measurement of reflected signal r(t).

The invention is applicable to any type of reference signal, for example a Gaussian pulse but also a sequence time-domain reflectometry (STDR) baseband digital sequence, a spread-spectrum time-domain reflectometry (SSTDR) signal or more generally any type of signal used in time-domain reflectometry. Advantageously, the reference signal used possesses good autocorrelation properties.

According to one variant embodiment of the invention, in order to improve the amplification of the peaks associated with soft defects, the method is applied a second time with replacement of the measurement of the reflected signal r(t) by the reflectogram z(t) obtained by the self-adaptive normalization of the intercorrelation.

Figure 2:
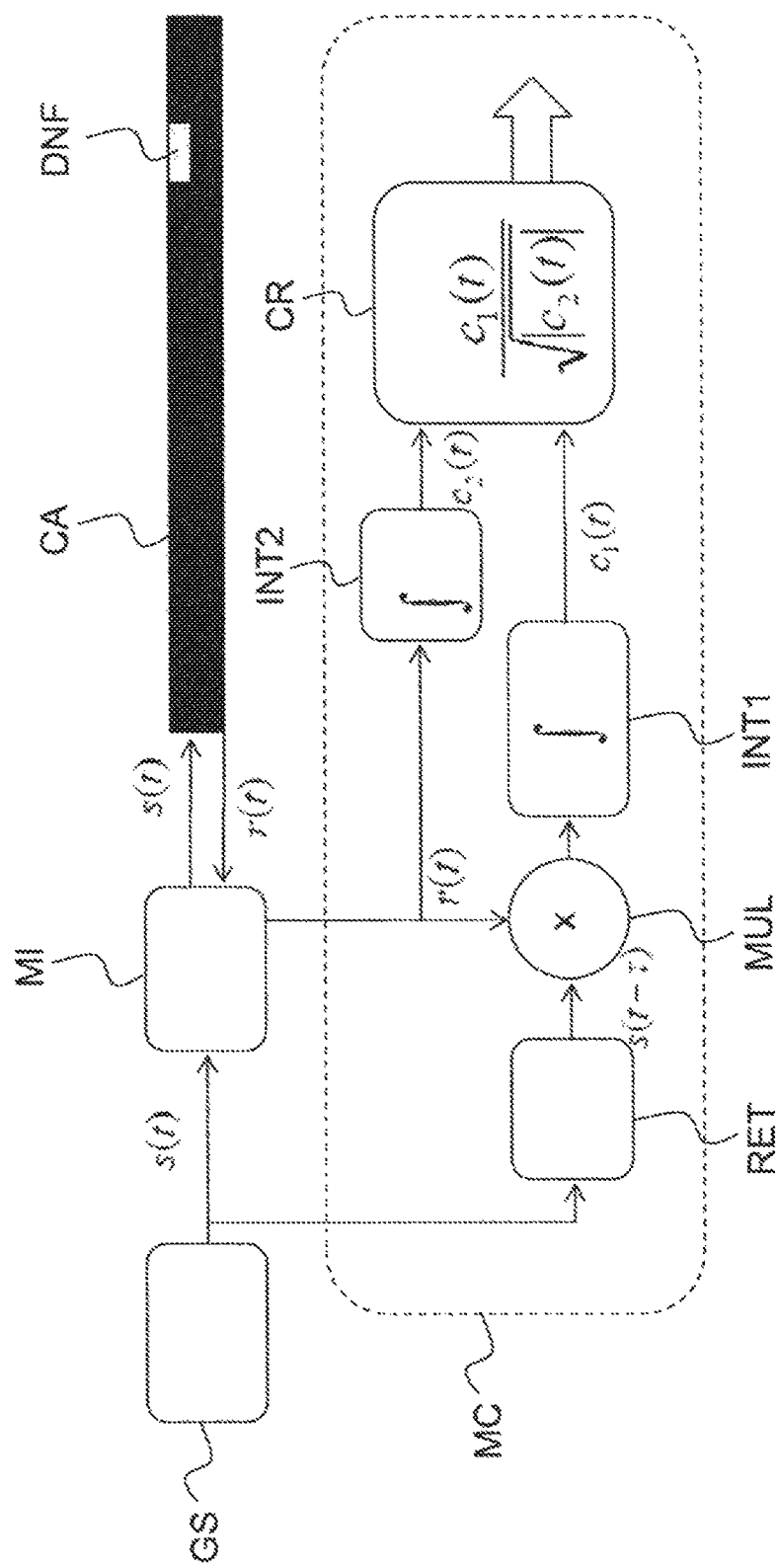
FIG. 2, a diagram of an exemplary embodiment of an analyzing device according to the invention.

FIG. 2 schematically shows, in a diagram, an exemplary reflectometry system able to implement the method according to the invention.

A reflectometry system, or reflectometer, includes at least one means GS, for generating a test signal and injecting it into the cable to be analyzed CA, a measuring means MI for measuring the signal reflected in the cable CA and an electronic integrated-circuit component MC, such as a programmable logic circuit, an FPGA for example, or a microcontroller, a digital signal processor for example, that receives a copy of the injected signal s(t) and the measurement of the reflected signal r(t) and is configured to execute the analyzing method described in FIG. 1 in order to generate a reflectogram z(t).

The means GS may consist of an analog signal generator, the signal for example being a signal in the form of a Gaussian pulse or any other time-domain reflectometry signal. The means for injecting the signal into the cable may consist of a coupler that may also serve to acquire a measurement of the reflected signal. If the signal is generated digitally, the means GS also comprises an analog-digital converter for converting the digital signal into an analog signal before its injection into the cable and an analog-digital converter for performing the inverse operation after the acquisition of the measurement of the reflected signal.

The signal may be injected into the cable and the reflected signal measured by one and the same component but also by two separate components, in particular when the injection point and the measurement point are disassociated.

The system shown in FIG. 2 may be implemented via an electronic board on which the various components are placed. The coupling and injecting means may be connected to an input/output that the board includes.

Furthermore, a processing unit such as a computer or personal digital assistant, inter alia, may be used to control the reflectometry device and display the results of the calculations performed by the component MC on a human-machine interface.

The method according to the invention may be implemented in the component MC using hardware and/or software elements. It may in particular be implemented by way of a computer program including instructions for its execution. The computer program may be recorded on a processor-readable storage medium.

When the component MC is implemented using hardware elements, it includes at least one delay line RET for delaying the test signal s(t), a multiplier MUL for multiplying the delayed test signal by the measurement of the reflected signal r(t), and a first integrator INT1 for integrating the result of the multiplication over a given duration in order to calculate the intercorrelation between the injected signal and the reflected signal. The component MC furthermore includes a second integrator INT2 for integrating the measurement of the reflected signal r(t) over the same duration as the duration of integration of the first integrator INT1. The component MC lastly includes a module for calculating a reflectogram CR from the outputs of the two integrators INT1, INT2 and while applying the method according to the invention. The integrators INT1, INT2 are configured to perform integrations over moving time windows in order to produce as output signals of duration substantially equal to that of the measurement of the reflected signal r(t).

The calculating module CR may furthermore be configured to analyze the produced reflectogram and to deduce therefrom a detection and/or a location of soft defects. This analysis may also be carried out by a processing unit that is separate from the system according to the invention and that receives a copy of the generated reflectogram and then applies additional processing operations in order to identify soft defects.

Figure 3:
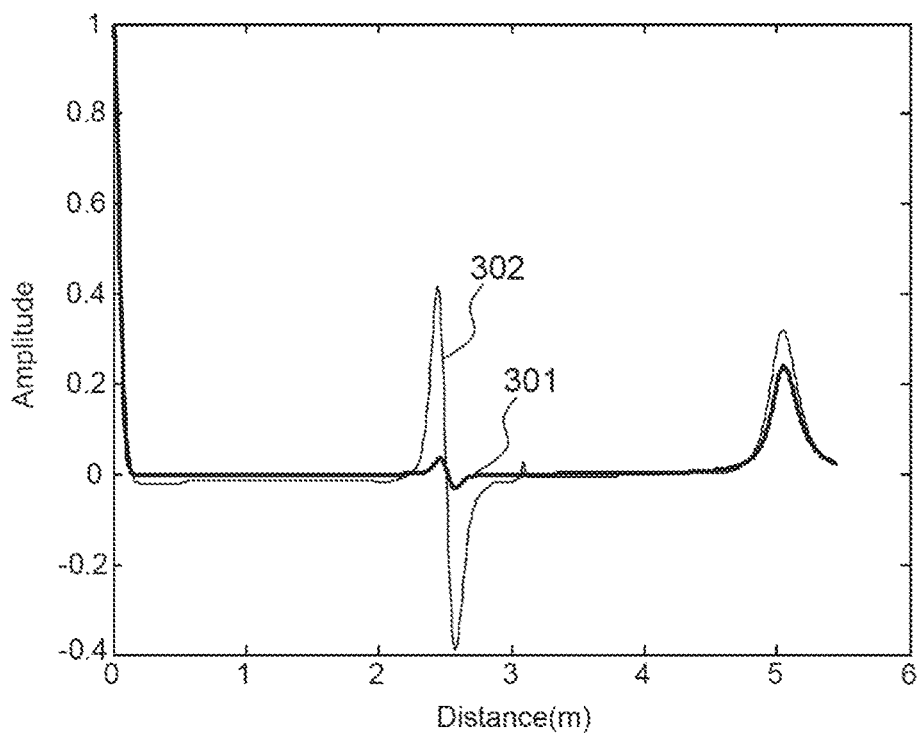
FIG. 3, a first example of comparison of time-domain reflectograms obtained with and without application of the invention.

FIG. 3 illustrates a graph showing the amplitude of a reflectogram as a function of the distance between the point of injection (identified by the origin 0 of the x-axis) and impedance discontinuities encountered by the signal during its propagation along the cable.

FIG. 3 shows a first reflectogram 301 that corresponds to a conventional application of a time-domain reflectometry method; in other words, the first reflectogram 301 corresponds to the non-normalized intercorrelation $C_1(t)$. A low-amplitude peak (at a distance of about 2.5 m) in this first reflectogram corresponds to the presence of a soft defect.

A second reflectogram 302 is shown and corresponds to the reflectogram z(t) obtained by applying the invention. It will be noted that the use of a normalized correlation allows the amplitude of the soft defect to be greatly amplified in order to make it possible to better distinguish it.

Figure 4:
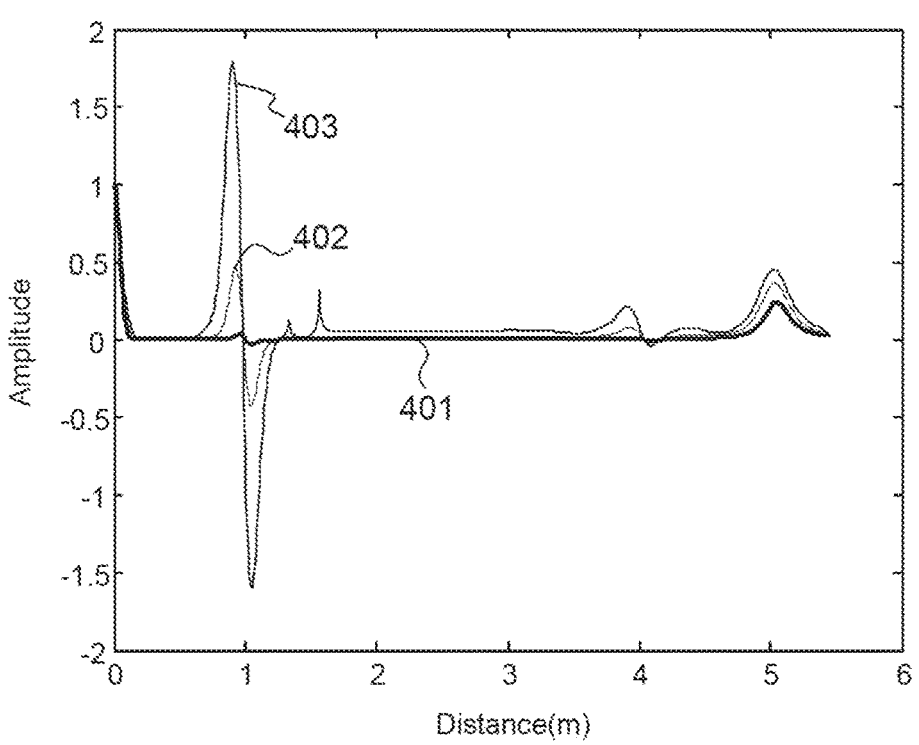
FIG. 4, a second example of reflectograms illustrating the results obtained by applying the method two times consecutively.

FIG. 4 shows a first reflectogram 401 corresponding to the use of a non-normalized intercorrelation, a second reflectogram 402 corresponding to the application of the method according to the invention and a third reflectogram 403 that corresponds to a second successive application of the method according to the invention to the reflectogram obtained after the first application of the method.

It will be noted that the double processing applied to the third reflectogram 403 allows the pulse associated with a soft defect to be further amplified.

Figure 5:
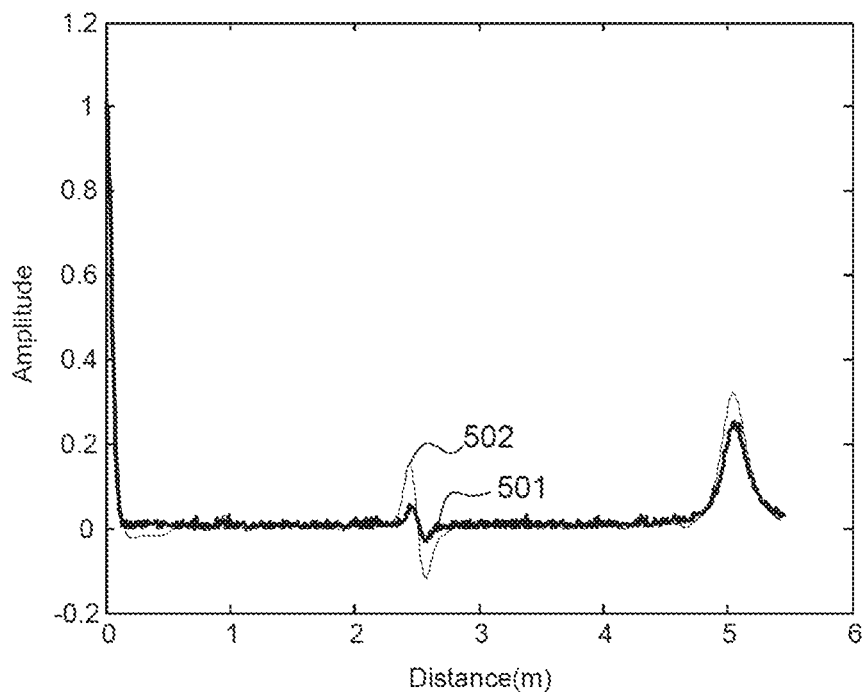
FIG. 5, a third example of reflectograms illustrating the results in the presence of measurement noise.

FIG. 5 shows a first reflectogram 501 obtained without applying the invention but in the presence of measurement noise. It should be noted that the amplitude of the peak associated with a soft defect becomes increasingly difficult to identify as the level of noise increases.

The second reflectogram 502 illustrates the result obtained using the invention and shows that the amplitude of the peak corresponding to the soft defect is amplified whereas artefacts associated with the measurement noise remain at a similar level to that in the first reflectogram 501.

Figure 6:
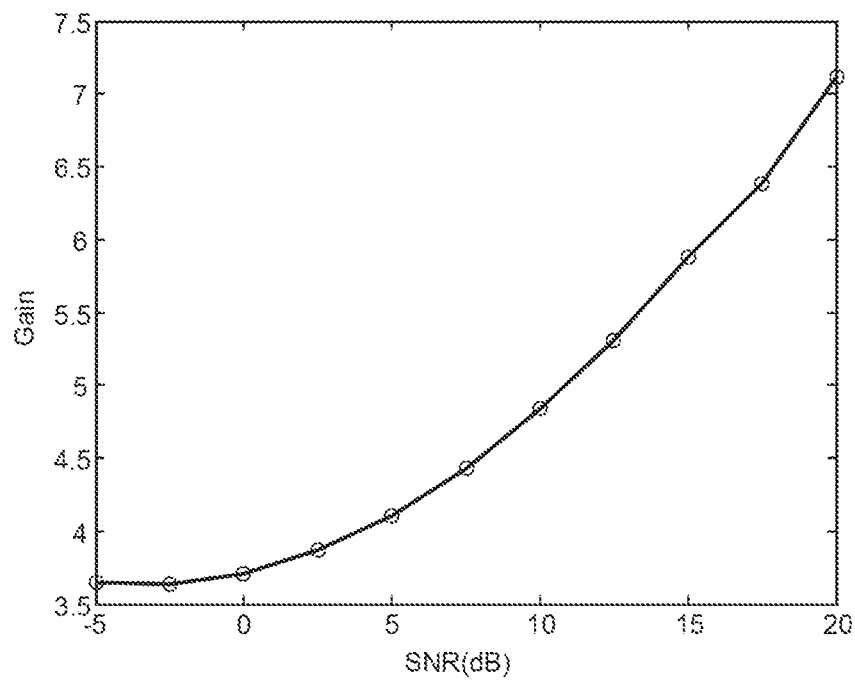
FIG. 6, a graph of the amplitude gain obtained for a soft defect by applying the invention as a function of signal-to-noise ratio.

FIG. 6 shows the amplification gain obtained for a peak associated with a soft defect as a function of the signal-to-noise ratio, represented on the x-axis in decibels. It will be noted that even at low signal-to noise ratios an amplification gain is obtained.

Figure 7:
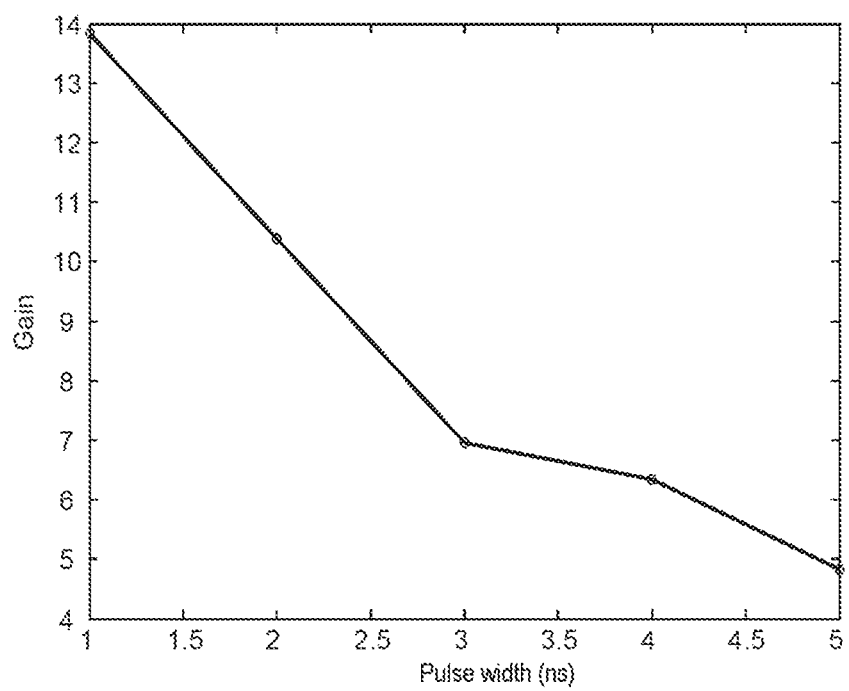
FIG. 7, a graph of the amplitude gain obtained for a soft defect by applying the invention as a function of pulse width.

FIG. 7 shows the amplification gain obtained for a peak associated with a soft defect as a function of the width of the pulse of the injected signal, expressed on the x-axis in nanoseconds. It will be noted that the amplification gain decreases when the pulse width increases. This observation allows the injected-signal pulse to be parameterized depending on the discrimination level that it is desired to obtain in the detection of soft defects.

The invention applies to the detection of soft defects that cause very small variations in characteristic impedance. In particular, such faults include scratches or wear of the cladding, of the dielectric, but also the start of degradation of the metal conductor or squashing of a cable. These degradations may initially seem benign and have no notable repercussions on the system. However, if nothing is done, mechanical and environmental stresses or even the ageing of the cable will cause a soft defect to progress to become a hard fault, the economic and material consequences of which may be considerable. Detecting nascent faults allows maintenance to be better managed and therefore repair costs to be decreased.

REFERENCES

[1] Y. J. Shin. "Theory and Application of Time-Frequency analysis to transient phenomena", in Electric Power and other Physical Systems. PhD Thesis, University of Texas, 2004.

The invention claimed is:

1. A method for analyzing a cable into which a reference signal s having a time support limited to a duration T is injected, the method comprising the steps of:
    calculating an intercorrelation, over a sliding window of duration D at least equal to 2T, between said injected reference signal s and a measurement r of a reflection of said reference signal s in the cable,
    dividing the calculated intercorrelation by a factor dependent on an integration of said reflection measurement r over the same sliding window of duration D to increase amplitude of signatures in the calculated intercorrelation that are representative of soft defects of the cable.

2. The method for analyzing a cable of claim 1, wherein the factor dependent on the integration of the reflection measurement r is equal to the absolute value of said integration raised to a power lower than one.

3. The method for analyzing a cable of claim 2, wherein said power is equal to ½.

4. The method for analyzing a cable of claim 1, wherein the factor dependent on the integration of the reflection measurement r is equal to the logarithm of the absolute value of said integration.

5. The method for analyzing a cable of claim 1, further comprising:
    calculating an intercorrelation, over a sliding window of duration D at least equal to 2T, between said injected reference signal s and the calculated intercorrelation,
    dividing the intercorrelation calculated in the preceding step by a factor dependent on the integration of the intercorrelation over the same sliding window of duration D.

6. The method for analyzing a cable of claim 1, wherein said method comprises seeking at least one extremum of the intercorrelation indicating the presence of a fault in the cable.

7. The method for analyzing a cable of claim 1, wherein the injected reference signal is a Gaussian pulse.

8. A reflectometry system comprising a device for analyzing a cable comprising a measurement apparatus for measuring, at a point of the cable, a signal reflected in the cable and a processor that is configured to execute a method for analyzing a cable into which a reference signal s having a time support limited to a duration T is injected, the method comprising the steps of:
    calculating an intercorrelation, over a sliding window of duration D at least equal to 2T, between said injected reference signal s and a measurement r of a reflection of said reference signal s in the cable,
    dividing the calculated intercorrelation by a factor dependent on an integration of said reflection measurement r over the same sliding window of duration D to increase amplitude of signatures in the calculated intercorrelation that are representative of soft defects of the cable.

9. The reflectometry system of claim 8, further comprising:
    an injecting device for injecting, at a point of the cable, a reference signal.

10. A computer program comprising instructions stored on a tangible non-transitory storage medium for executing on a processor a method for analyzing a cable into which a reference signal s having a time support limited to a duration T is injected, the method comprising the steps of:
    calculating an intercorrelation, over a sliding window of duration D at least equal to 2T, between said injected reference signal s and a measurement r of a reflection of said reference signal s in the cable,
    dividing the calculated intercorrelation by a factor dependent on an integration of said reflection measurement r over the same sliding window of duration D to increase amplitude of signatures in the calculated intercorrelation that are representative of soft defects of the cable.

11. A tangible non-transitory processor-readable recording medium on which is stored a program comprising instructions for executing a method for analyzing a cable into which a reference signal s having a time support limited to a duration T is injected, the method comprising the steps of:
    calculating an intercorrelation, over a sliding window of duration D at least equal to 2T, between said injected reference signal s and a measurement r of a reflection of said reference signal s in the cable,
    dividing the calculated intercorrelation by a factor dependent on an integration of said reflection measurement r over the same sliding window of duration D to increase amplitude of signatures in the calculated intercorrelation that are representative of soft defects of the cable.

* * * * *